(12) United States Patent
Kajiwara et al.

(10) Patent No.: US 11,251,293 B2
(45) Date of Patent: Feb. 15, 2022

(54) SEMICONDUCTOR DEVICE

(71) Applicant: KABUSHIKI KAISHA TOSHIBA, Minato-ku (JP)

(72) Inventors: Yosuke Kajiwara, Yokohama (JP); Hiroshi Ono, Setagaya (JP); Jumpei Tajima, Mitaka (JP); Toshiki Hikosaka, Kawasaki (JP); Shinya Nunoue, Ichikawa (JP); Masahiko Kuraguchi, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 37 days.

(21) Appl. No.: 16/802,315

(22) Filed: Feb. 26, 2020

(65) Prior Publication Data
US 2021/0066486 A1 Mar. 4, 2021

(30) Foreign Application Priority Data
Sep. 2, 2019 (JP) .............................. JP2019-159474

(51) Int. Cl.
*H01L 29/778* (2006.01)
*H01L 29/20* (2006.01)
(Continued)

(52) U.S. Cl.
CPC ...... *H01L 29/7786* (2013.01); *H01L 29/0684* (2013.01); *H01L 29/2003* (2013.01);
(Continued)

(58) Field of Classification Search
CPC ............. H01L 29/7786; H01L 29/2003; H01L 29/205; H01L 29/207; H01L 29/4236;
(Continued)

(56) References Cited

U.S. PATENT DOCUMENTS 8,748,979 B2 6/2014 Takeda
9,412,858 B2 8/2016 Okita et al.
(Continued)

FOREIGN PATENT DOCUMENTS

| JP | 6084357 B2 | 2/2017 |
| JP | 6229172 B2 | 11/2017 |
| JP | 6447231 B2 | 1/2019 |

OTHER PUBLICATIONS

Jiejie Zhu, et al., "Ferroelectric Gate AlGaN/GaN E-Mode HEMTs With High Transport and Sub-Threshold Performance", IEEE Electron Device Letters, vol. 39,No. 1, Jan. 2018, pp. 79-82.

*Primary Examiner* — Shahed Ahmed
(74) *Attorney, Agent, or Firm* — Oblon, McClelland, Maier & Neustadt, L.L.P.

(57) ABSTRACT

According to one embodiment, a semiconductor device includes first to fourth semiconductor regions, and an insulating part. The third electrode is between the first and second electrodes in a first direction from the first electrode toward the second electrode. The first semiconductor region includes $Al_{x1}Ga_{1-x1}N$ and includes first to fifth partial regions. A second direction from the first partial region toward the first electrode crosses the first direction. The second semiconductor region includes $Al_{x2}Ga_{1-x2}N$ and includes sixth and seventh partial regions. The third semiconductor region includes $Al_{x3}Ga_{1-x3}N$ and includes an eighth partial region between the fifth and seventh partial regions. The fourth semiconductor region includes $Al_{x4}Ga_{1-x4}N$ and includes a first portion between the fifth and eighth partial regions. The fourth semiconductor region includes a first element not included the first to third semiconductor regions. The insulating part includes first to third insulating regions.

20 Claims, 12 Drawing Sheets

(51) Int. Cl.
  *H01L 29/205*  (2006.01)
  *H01L 29/207*  (2006.01)
  *H01L 29/423*  (2006.01)
  *H01L 29/36*  (2006.01)
  *H01L 29/51*  (2006.01)
  *H01L 29/417*  (2006.01)
  *H01L 29/06*  (2006.01)
(52) U.S. Cl.
  CPC .......... *H01L 29/205* (2013.01); *H01L 29/207* (2013.01); *H01L 29/36* (2013.01); *H01L 29/41725* (2013.01); *H01L 29/4236* (2013.01); *H01L 29/42376* (2013.01); *H01L 29/517* (2013.01)
(58) Field of Classification Search
  CPC .................. H01L 29/36; H01L 29/517; H01L 29/41725; H01L 29/42376; H01L 29/0684; H01L 29/1045; H01L 29/045; H01L 29/778–7789; H01L 29/122–127; H01L 29/15–158; H01L 29/66431; H01L 29/66462
  See application file for complete search history.

(56) References Cited

U.S. PATENT DOCUMENTS

| | | | |
|---|---|---|---|
| 2001/0040346 A1* | 11/2001 | Takashima | F16J 9/206 277/434 |
| 2003/0218183 A1* | 11/2003 | Micovic | H01L 21/28581 257/192 |
| 2013/0313560 A1* | 11/2013 | Khalil | H01L 29/2003 257/76 |
| 2014/0264273 A1* | 9/2014 | Howell | H01L 29/1037 257/20 |
| 2016/0351564 A1* | 12/2016 | Azize | H01L 29/66621 |
| 2017/0330944 A1* | 11/2017 | Baines | H01L 29/0843 |
| 2019/0189757 A1* | 6/2019 | Makiyama | H01L 29/7786 |

* cited by examiner

SEMICONDUCTOR DEVICE

CROSS-REFERENCE TO RELATED APPLICATIONS

This application is based upon and claims the benefit of priority from Japanese Patent Application No. 2019-159474, filed on Sep. 2, 2019; the entire contents of which are incorporated herein by reference.

FIELD

Embodiments described herein relate generally to a semiconductor device.

BACKGROUND

For example, there is a semiconductor device such as a transistor or the like that uses a nitride semiconductor. It is desirable to improve the characteristics of the semiconductor device.

DETAILED DESCRIPTION

Figure 1:
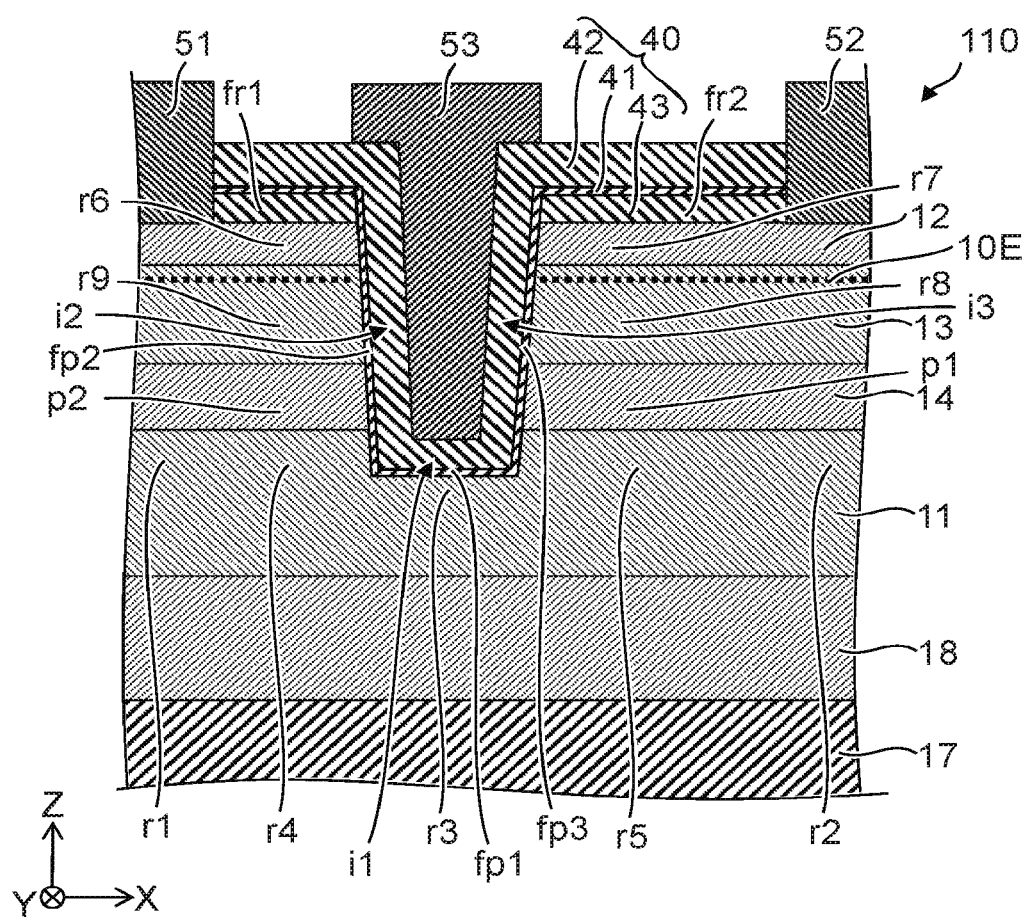
FIG. 1 is a schematic cross-sectional view illustrating a semiconductor device according to a first embodiment.

According to one embodiment, a semiconductor device includes a first electrode, a second electrode, a third electrode, a first semiconductor region, a second semiconductor region, a third semiconductor region, a fourth semiconductor region, and an insulating part. A position of the third electrode in a first direction is between a position of the first electrode in the first direction and a position of the second electrode in the first direction. The first direction is from the first electrode toward the second electrode. The first semiconductor region includes $Al_{x1}Ga_{1-x1}N$ ($0 \leq x1 < 1$) and includes a first partial region, a second partial region, a third partial region, a fourth partial region, and a fifth partial region. A second direction from the first partial region toward the first electrode crosses the first direction. A direction from the second partial region toward the second electrode is along the second direction. A direction from the third partial region toward the third electrode is along the second direction. The fourth partial region is between the first partial region and the third partial region in the first direction. The fifth partial region is between the third partial region and the second partial region in the first direction. The second semiconductor region includes $Al_{x2}Ga_{1-x2}N$ ($0 < x2 \leq 1$ and $x1 < x2$) and includes a sixth partial region and a seventh partial region. A direction from the fourth partial region toward the sixth partial region is along the second direction. A direction from the fifth partial region toward the seventh partial region is along the second direction. The third semiconductor region includes $Al_{x3}Ga_{1-x3}N$ ($0 \leq x3 < 1$ and $x3 < x2$). The third semiconductor region includes an eighth partial region. The eighth partial region is between the fifth partial region and the seventh partial region. The fourth semiconductor region includes $Al_{x4}Ga_{1-x4}N$ ($0 \leq x4 < 1$ and $x4 < x2$). The fourth semiconductor region includes a first portion. The first portion is between the fifth partial region and the eighth partial region. The fourth semiconductor region includes a first element including at least one selected from the group consisting of Mg, Zn, and C. The first semiconductor region, the second semiconductor region, and the third semiconductor region do not include the first element, or a concentration of the first element in the first semiconductor region, a concentration of the first element in the second semiconductor region, and a concentration of the first element in the third semiconductor region each are lower than a concentration of the first element in the fourth semiconductor region. The insulating part includes a first insulating region, a second insulating region, and a third insulating region. The first insulating region is between the third partial region and the third electrode in the second direction and between a portion of the fourth partial region and a portion of the fifth partial region in the first direction. The second insulating region is between the sixth partial region and the third electrode in the first direction. The third insulating region is between the third electrode and the first portion in the first direction, between the third electrode and the eighth partial region in the first direction, and between the third electrode and the seventh partial region in the first direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first electrode 51, a second electrode 52, a third electrode 53, a first semiconductor region 11, a second semiconductor region 12, a third semiconductor region 13, a fourth semiconductor region 14, and an insulating part 40. In the example, the semiconductor device 110 includes a base body 17 and a semiconductor region 18.

The direction from the first electrode 51 toward the second electrode 52 is taken as a first direction.

The first direction is taken as an X-axis direction. One direction perpendicular to the X-axis direction is taken as a Z-axis direction. A direction perpendicular to the X-axis direction and the Z-axis direction is taken as a Y-axis direction.

The position of the third electrode 53 in the first direction (the X-axis direction) is between the position of the first electrode 51 in the first direction and the position of the second electrode 52 in the first direction. For example, at least a portion of the third electrode 53 is between the first electrode 51 and the second electrode 52 in the X-axis direction.

The first semiconductor region 11 includes $Al_{x1}Ga_{1-x1}N$ ($0 \leq x1 < 1$). The first semiconductor region 11 includes, for example, GaN. The first semiconductor region 11 includes a first partial region r1, a second partial region r2, a third partial region r3, a fourth partial region r4, and a fifth partial region r5.

The direction from the first partial region r1 toward the first electrode 51 is taken as a second direction. The second direction crosses the first direction (the X-axis direction). The second direction is, for example, the Z-axis direction.

The direction from the second partial region r2 toward the second electrode 52 is along the second direction (e.g., the Z-axis direction). The direction from the third partial region r3 toward the third electrode 53 is along the second direction.

The fourth partial region r4 is between the first partial region r1 and the third partial region r3 in the first direction (the X-axis direction). The fifth partial region r5 is between the third partial region r3 and the second partial region r2 in the first direction.

The second semiconductor region 12 includes $Al_{x2}Ga_{1-x2}N$ ($0 < x2 \leq 1$ and $x1 < x2$). The second semiconductor region 12 includes, for example, AlGaN. The composition ratio x2 of Al is, for example, not less than 0.10 and not more than 0.35.

The second semiconductor region 12 includes a sixth partial region r6 and a seventh partial region r7. The direction from the fourth partial region r4 toward the sixth partial region r6 is along the second direction (e.g., the Z-axis direction). The direction from the fifth partial region r5 toward the seventh partial region r7 is along the second direction.

The third semiconductor region 13 includes $Al_{x3}Ga_{1-x3}N$ ($0 \leq x3 < 1$ and $x3 < x2$). The third semiconductor region 13 includes, for example, GaN.

The third semiconductor region 13 includes an eighth partial region r8. The eighth partial region r8 is between the fifth partial region r5 and the seventh partial region r7.

The fourth semiconductor region 14 includes $Al_{x4}Ga_{1-x4}N$ ($0 \leq x4 < 1$ and $x4 < x2$). The fourth semiconductor region 14 includes, for example, GaN. The fourth semiconductor region 14 includes a first portion p1. The first portion p1 is between the fifth partial region r5 and the eighth partial region r8.

In the example, the third semiconductor region 13 includes a ninth partial region r9. The ninth partial region r9 is between the fourth partial region r4 and the sixth partial region r6. The fourth semiconductor region 14 further includes a second portion p2. The second portion p2 is between the fourth partial region r4 and the ninth partial region r9.

As described below, the third semiconductor region 13 may not include the ninth partial region r9; and the fourth semiconductor region 14 may not include the second portion p2. An example will now be described in which the third semiconductor region 13 includes the ninth partial region r9, and the fourth semiconductor region 14 includes the second portion p2.

The fourth semiconductor region 14 includes a first element. The first element includes at least one selected from the group consisting of Mg and Zn. The first element may include at least one selected from the group consisting of Mg, Zn, and C. The first semiconductor region 11, the second semiconductor region 12, and the third semiconductor region 13 do not include the first element. Or, the concentration of the first element in the first semiconductor region 11, the concentration of the first element in the second semiconductor region 12, and the concentration of the first element in the third semiconductor region 13 each are lower than the concentration of the first element in the fourth semiconductor region 14.

For example, the fourth semiconductor region 14 includes Mg. The fourth semiconductor region 14 includes, for example, p-type GaN or p-type AlGaN. For example, the first semiconductor region 11 and the third semiconductor region 13 include non-doped i-GaN. For example, the second semiconductor region 12 includes non-doped i-AlGaN.

The insulating part 40 includes a first insulating region i1, a second insulating region i2, and a third insulating region i3. The first insulating region i1 is between the third partial region r3 and the third electrode 53 in the second direction (e.g., the Z-axis direction). At least a portion of the first insulating region i1 is between a portion of the fourth partial region r4 and a portion of the fifth partial region r5 in the first direction (the X-axis direction). The second insulating region i2 is between the sixth partial region r6 and the third electrode 53 in the first direction (the X-axis direction). In the first direction (the X-axis direction), the third insulating region i3 is between the third electrode 53 and the first portion p1, between the third electrode 53 and the eighth partial region r8, and between the third electrode 53 and the seventh partial region r7. For example, the first portion p1 contacts the third insulating region i3.

In the example, the third semiconductor region 13 includes the ninth partial region r9; and the fourth semiconductor region 14 includes the second portion p2. In such a case, in the first direction (the X-axis direction), portions of the second insulating region i2 are between the second portion p2 and the third electrode 53 and between the ninth partial region r9 and the third electrode 53. For example, the second portion p2 contacts the second insulating region i2.

For example, the semiconductor region 18 is provided on the base body 17. The base body 17 is, for example, a silicon substrate. The semiconductor region 18 is, for example, a buffer layer. The semiconductor region 18 includes, for example, a nitride semiconductor. A stacked film that includes the semiconductor regions recited above is formed on the semiconductor region 18 by epitaxial growth, etc. The fourth semiconductor region 14 may be formed by epitaxial growth or may be formed by ion doping.

As shown in FIG. 1, for example, a carrier region 10E is generated in the third semiconductor region 13 at the second semiconductor region 12 side. The carrier region 10E is, for example, a two-dimensional electron gas.

For example, the first electrode 51 functions as a source electrode. For example, the second electrode 52 functions as a drain electrode. For example, the third electrode 53 functions as a gate electrode. A current that flows in a current path between the first electrode 51 and the second electrode 52 can be controlled by a voltage applied to the third electrode 53. The semiconductor device 110 is, for example, a HEMT (High Electron Mobility Transistor).

For example, a first reference example may be considered in which p-type GaN is used as the first semiconductor region 11. In such a case, p-type GaN is provided under the first insulating region i1 under the third electrode 53. The threshold voltage can be increased thereby. However, the carrier mobility is reduced by the existence of the p-type GaN including Mg, etc.

Conversely, in the semiconductor device 110, for example, the third partial region r3 of i-GaN is under the first insulating region i1 under the third electrode 53. Therefore, a high carrier mobility can be maintained without the effects of Mg, etc. A low on-resistance is obtained thereby.

In the semiconductor device 110, the first portion p1 (the p-type region) that includes the first element such as Mg or the like is provided. Holes are generated in the first portion p1. Electrons that cancel the holes are generated when the voltage applied to the third electrode 53 increases. Thereby, a current starts to flow at the interface between the third insulating region i3 and the first portion p1. Thereby, the current path between the first electrode 51 and the second electrode 52 is set to the on-state. By providing the first portion p1 in the embodiment, the threshold voltage can be high compared to the case where the first portion p1 is not provided.

In the embodiment, a high threshold voltage is obtained while obtaining a low on-resistance. According to the embodiment, a semiconductor device can be provided in which the characteristics can be improved.

The region where the first insulating region i1 and the third partial region r3 oppose each other corresponds to a first path of the current path. The length in the X-axis direction of the first path is long, e.g., 500 nm or more. The resistance of the first path substantially has a relationship with the on-resistance.

On the other hand, the region where the third insulating region i3 and the first portion p1 oppose each other is a second path of the current path. The length of the second path substantially corresponds to the thickness of the first portion p1. The resistance of the second path substantially can be ignored by setting the thickness of the first portion p1 to be sufficiently less than the length of the region where the first insulating region i1 and the third partial region r3 oppose each other. For example, the region where the third insulating region i3 and the first portion p1 oppose each other has a function of increasing the threshold voltage. Due to this region, the increase of the resistance substantially can be ignored. On the other hand, the mobility in the region where the first insulating region i1 and the third partial region r3 oppose each other can be increased. In the embodiment, a high threshold voltage is obtained while obtaining a low on-resistance.

As shown in FIG. 1, for example, the insulating part 40 may include a first film 41. The first film 41 includes $Al_{x5}Ga_{1-x5}N$ ($0<x5\leq1$, $x1<x5$, $x3<x5$, and $x4<x5$). The first film 41 includes AlN or AlGaN. The first film 41 includes, for example, a first film portion fp1, a second film portion fp2, and a third film portion fp3. The first film portion fp1 is between the third partial region r3 and the third electrode 53 in the second direction (the Z-axis direction). The first film portion fp1 is between a portion of the fourth partial region r4 and a portion of the fifth partial region r5 in the first direction (the X-axis direction). The second film portion fp2 is between the sixth partial region r6 and the third electrode 53 in the first direction (the X-axis direction). In the first direction (the X-axis direction), the third film portion fp3 is between the third electrode 53 and the first portion p1, between the third electrode 53 and the eighth partial region r8, and between the third electrode 53 and the seventh partial region r7. By providing the first film 41, for example, the mobility can be increased. For example, the on-resistance of the semiconductor device can be reduced.

The insulating part 40 may include a second film 42. The second film 42 includes, for example, oxygen and at least one selected from the group consisting of silicon, aluminum, and hafnium. The second film 42 may include nitrogen in addition to the materials recited above. The second film 42 includes, for example, silicon oxide. The second film 42 may include, for example, at least one selected from the group consisting of aluminum oxide, aluminum oxide silicon, aluminum oxynitride, and hafnium oxide silicon. The second film 42 is between the first film 41 and the third electrode 53. By such a second film 42, high reliability is obtained. Stable characteristics are obtained.

The insulating part 40 may include a third film 43. The third film 43 includes, for example, nitrogen and at least one selected from the group consisting of silicon and aluminum. The third film 43 may include oxygen in addition to the materials recited above. The third film 43 includes, for example, silicon nitride. The third film 43 may include, for example, at least one selected from the group consisting of silicon oxynitride and aluminum oxynitride. The third film 43 includes a first film region fr1 and a second film region fr2. The sixth partial region r6 is between the fourth partial region r4 and the first film region fr1 in the second direction (the Z-axis direction). The seventh partial region r7 is between the eighth partial region r8 and the second film region fr2 in the second direction. By such a third film 43, for example, the trap density at the interface with the second semiconductor region 12 can be reduced. For example, the current collapse can be reduced. High reliability is obtained. Stable characteristics are obtained.

As shown in FIG. 1, for example, a portion of the third electrode 53 may be between a portion of the fourth partial region r4 and a portion of the fifth partial region r5 in the first direction (the X-axis direction).

For example, the first electrode 51 contacts the sixth partial region r6. The second electrode 52 contacts the seventh partial region r7. For example, the first electrode 51 is electrically connected to the sixth partial region r6. For example, the first electrode 51 may be electrically connected to the ninth partial region r9. For example, the second electrode 52 is electrically connected to the seventh partial region r7. For example, the second electrode 52 may be electrically connected to the eighth partial region r8. For example, the first electrode 51 is electrically connected to the carrier region 10E. For example, the second electrode 52 is electrically connected to the carrier region 10E.

Figure 2:
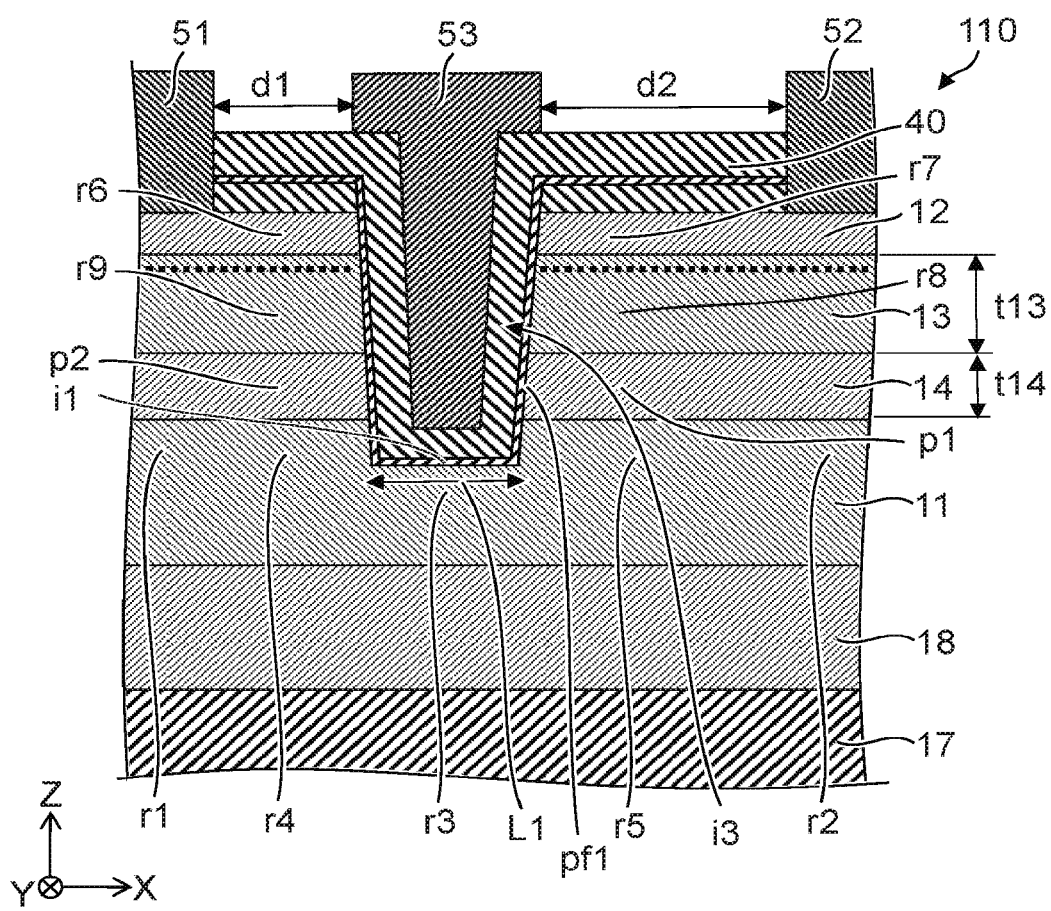
FIG. 2 is a schematic cross-sectional view illustrating the semiconductor device according to the first embodiment.

FIG. 2 is a schematic cross-sectional view illustrating the semiconductor device according to the first embodiment.

As shown in FIG. 2, the length along the first direction (the X-axis direction) of the first insulating region i1 is taken as a length L1. The length along the second direction (the Z-axis direction) of the first portion p1 is taken as a length t14. For example, the length t14 corresponds to the thickness of the fourth semiconductor region 14. For example, the length L1 is longer than the length t14. The length t14 is shorter than the length L1. The length of the region where the third insulating region i3 and the first portion p1 oppose each other is short. The threshold voltage can be increased while suppressing the increase of the on-resistance.

For example, the length L1 is 300 nm or more. The length L1 may be 500 nm or more. The length L1 may be 800 nm or more. The length L1 is, for example, 5 μm or less.

For example, the length t14 along the second direction of the first portion p1 is 200 nm or less. The increase of the on-resistance substantially can be suppressed thereby. The length t14 is, for example, 50 nm or more. Thereby, for example, the threshold voltage can be increased effectively.

The length along the second direction (the Z-axis direction) of the eighth partial region r8 is taken as a length t13. The length t13 corresponds to the thickness of the third semiconductor region 13. For example, it is favorable for the length t13 to be not less than 100 nm and not more than 400 nm. A low on-resistance is easier to obtain thereby.

For example, the distance along the first direction (the X-axis direction) between the first electrode 51 and the third electrode 53 is taken as a distance d1. The distance along the first direction between the third electrode 53 and the second electrode 52 is taken as a distance d2. The distance d1 is shorter than the distance d2. By lengthening the distance d2, breakdown or the like is suppressed; and stable characteristics are easier to obtain.

The first portion p1 has a first opposing surface pf1 opposing the third insulating region i3. The first opposing surface pf1 crosses the upper surface of the first semiconductor region 11 (the X-Y plane). In one example, the first opposing surface pf1 crosses the c-plane of the first semiconductor region 11. For example, the opposing surface pf1 may be along the m-plane or the a-plane of the first semiconductor region 11. Thereby, for example, a higher threshold is obtained.

An example of characteristics of the semiconductor device will now be described.

Figure 3:
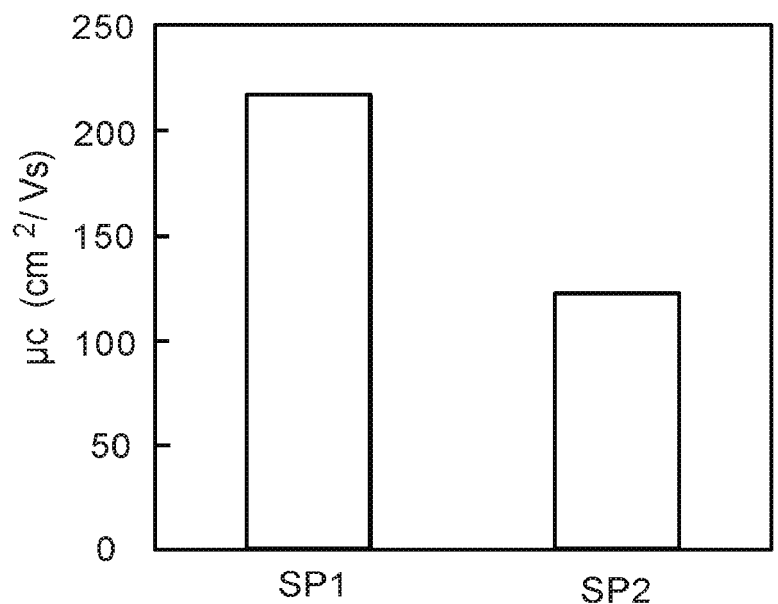
FIG. 3 is a graph illustrating a characteristic of the semiconductor device.

FIG. 3 is a graph illustrating a characteristic of the semiconductor device.

FIG. 3 illustrates the measurement results of the carrier mobility of a first sample SP1 and a second sample SP2 recited below. In the first sample SP1, i-GaN is provided under the first insulating region i1 under the third electrode 53 (the gate electrode). In the second sample SP2, p-type GaN is provided under the first insulating region i1 under the third electrode 53 (the gate electrode). The vertical axis of FIG. 3 is a carrier mobility μc ($cm^2/Vs$).

It can be seen from FIG. 3 that for the second sample SP2 in which p-type GaN is provided under the gate electrode, the carrier mobility μc is low, i.e., about ½ of that of the first sample SP1 in which i-GaN is provided under the gate electrode. In the embodiment, the third partial region r3 of i-GaN or the like is provided under the first insulating region i1 under the third electrode 53 (the gate electrode). The third partial region r3 does not include the first element. Or, the concentration of the first element in the third partial region r3 is lower than the concentration of the first element in the first portion p1. A high mobility is obtained thereby.

Figure 4:
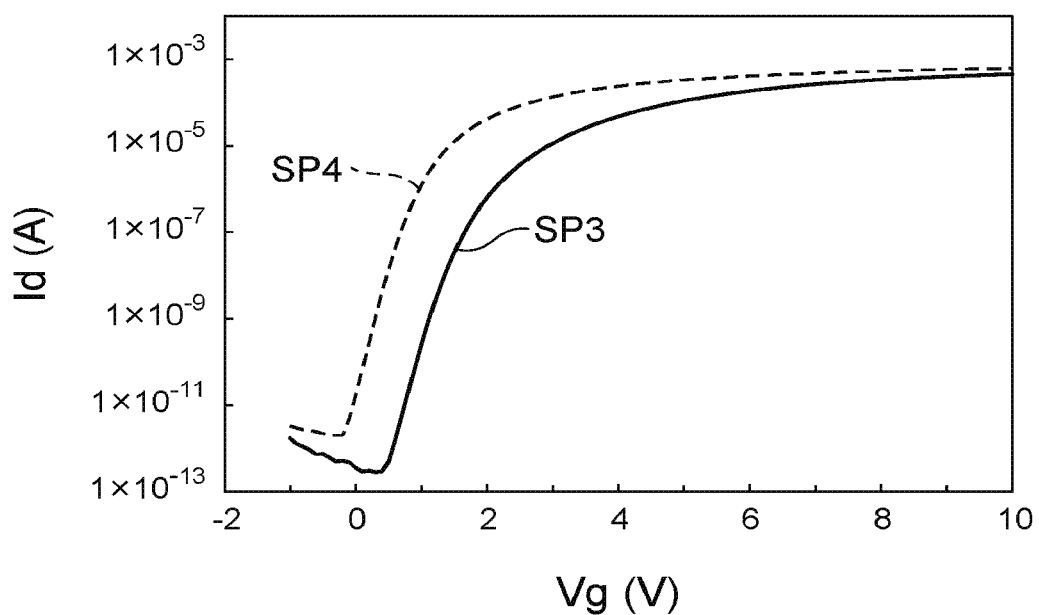
FIG. 4 is a graph illustrating a characteristic of the semiconductor device.

FIG. 4 is a graph illustrating a characteristic of the semiconductor device.

FIG. 4 illustrates the threshold characteristic of a third sample SP3 and a fourth sample SP4 recited below. The first portion p1 and the second portion p2 of the p-type are provided in the third sample SP3. The third sample SP3 corresponds to the semiconductor device 110 according to the embodiment. The first portion p1 and the second portion p2 of the p-type are not provided in the fourth sample SP4.

The horizontal axis of FIG. 4 is a gate voltage Vg (V). The gate voltage Vg corresponds to the voltage applied to the third electrode 53. The vertical axis of FIG. 4 is a drain current Id (A). The drain current Id is the current flowing between the first electrode 51 and the second electrode 52.

It can be seen from FIG. 4 that compared to the fourth sample SP4, the threshold voltage is high for the third sample SP3. A high threshold voltage is obtained by providing the p-type region.

Examples of the effects of the crystal orientation of the first portion p1 on the characteristics will now be described.

Figure 5A:
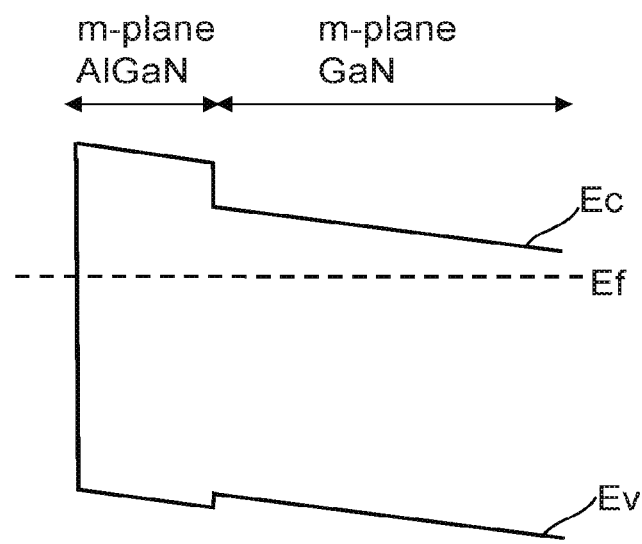
FIG. 5A and FIG. 5B are graphs illustrating characteristics of the semiconductor device.
Figure 5B:
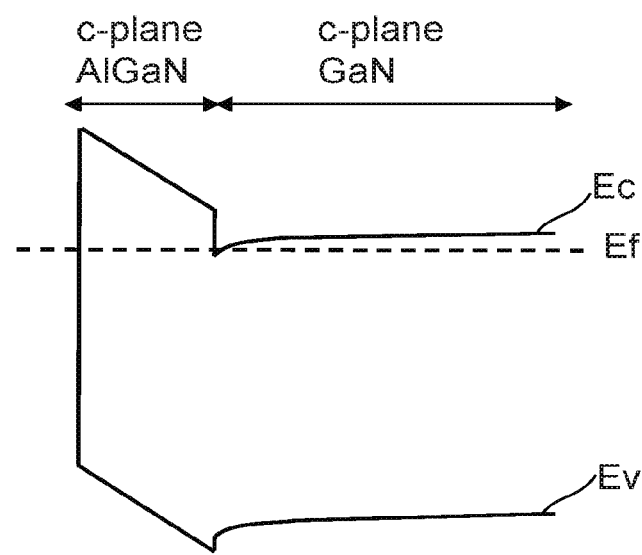

FIG. 5A and FIG. 5B are graphs illustrating characteristics of the semiconductor device.

In the example, the characteristics are illustrated for the case where the first film 41 of AlGaN is provided. These figures illustrate the band characteristics at the interface between the first portion p1 and the third film portion fp3 of the first film 41. The third film portion fp3 corresponds to AlGaN. In FIG. 5A, the surface (the interface) where the first portion p1 and the AlGaN corresponding to the third film portion fp3 contact each other is the m-plane. In FIG. 5B, the surface (the interface) where the first portion p1 and the AlGaN corresponding to the third film portion fp3 contact each other is the c-plane. These figures show an energy Ev of the valence band, an energy Ec of the conduction band, and a Fermi energy Ef.

As shown in FIG. 5B, when the interface is a polar plane such as the c-plane, the energy becomes low locally at the interface between the AlGaN and the GaN. It is considered that this is due to the polarization charge generated at the polar plane interface. The threshold voltage decreases when the energy becomes low locally.

On the other hand, as shown in FIG. 5A, when the interface is a non-polar plane such as the m-plane, the energy does not decrease locally at the interface between the AlGaN and the GaN. It is considered that this is because a polarization charge is not generated. Because the energy does not decrease locally, the decrease of the threshold voltage can be suppressed.

Thus, is a high threshold voltage is obtained more easily by setting the interface between the third film portion fp3 and the first portion p1 to be a non-polar plane (or a semi-polar plane).

In the embodiment, it is favorable for the first opposing surface pf1 to cross the c-plane of the first semiconductor region 11. For example, it is favorable for the opposing surface pf1 to be along the m-plane or the a-plane of the first semiconductor region 11. Thereby, for example, a higher threshold voltage is obtained.

Figure 6:
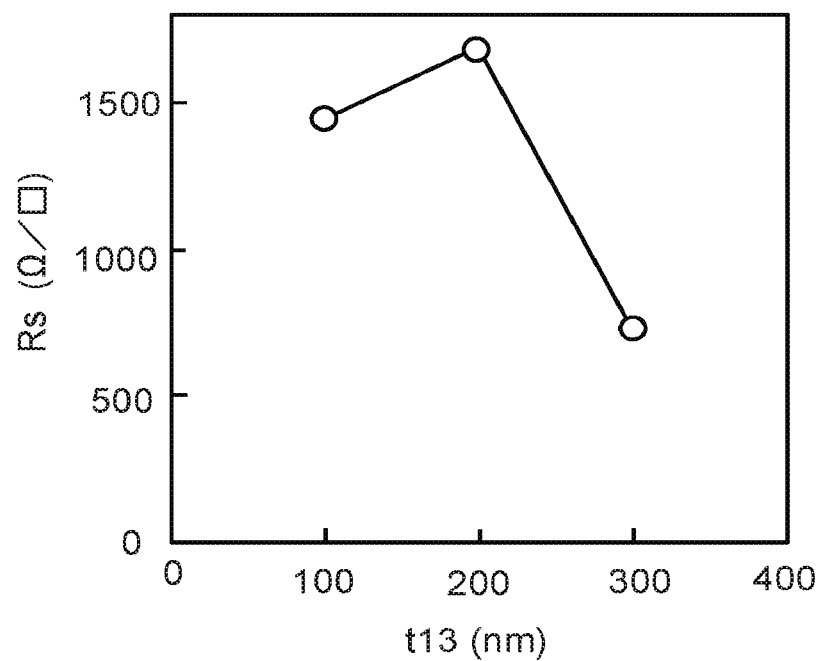
FIG. 6 is a graph illustrating a characteristic of the semiconductor device.

FIG. 6 is a graph illustrating a characteristic of the semiconductor device.

FIG. 6 illustrates the sheet resistance of the carrier region 10E for the configuration of the semiconductor device 110 when the thickness (the length t13) of the third semiconductor region 13 is changed. The horizontal axis of FIG. 6 is the length t13 (nm). The vertical axis is a sheet resistance Rs (Ω/□). The sheet resistance Rs is about 530Ω/□ when the fourth semiconductor region 14 is not provided.

As shown in FIG. 6, the sheet resistance Rs is reduced by lengthening the length t13 (the thickness). For example, the sheet resistance Rs becomes excessively high when the length t13 is less than 100 nm. When the length t13 is excessively long, the trench for the third electrode 53 becomes excessively deep; and there is a tendency for the channel resistance of the gate part to increase. In the embodiment, it is favorable for the length t13 to be, for example, not less than 100 nm and not more than 400 nm.

Figure 7:
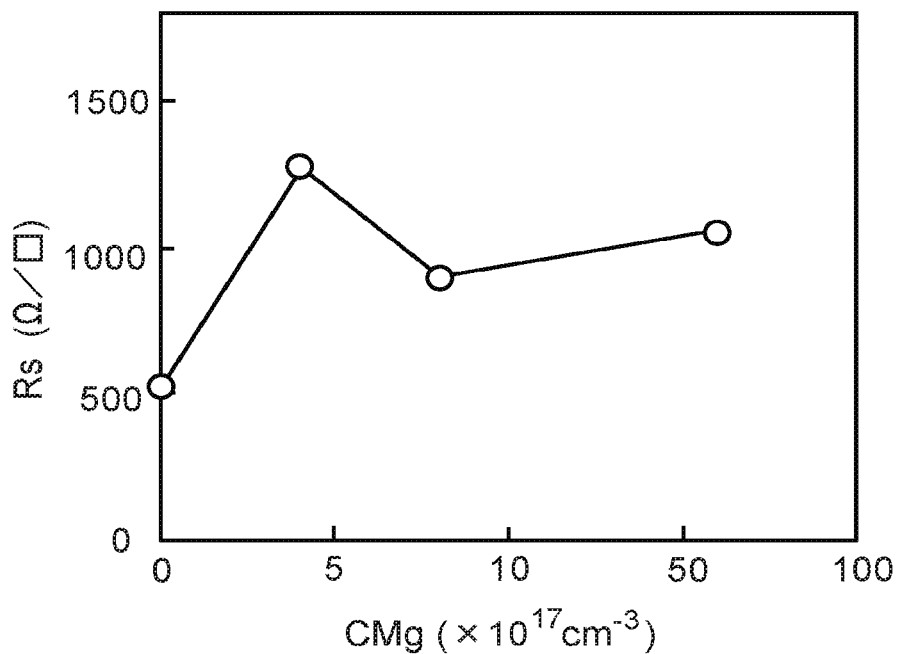
FIG. 7 is a graph illustrating a characteristic of the semiconductor device.

FIG. 7 is a graph illustrating a characteristic of the semiconductor device.

FIG. 7 illustrates the sheet resistance Rs of the carrier region 10E when the concentration of the first element in the fourth semiconductor region 14 is changed. The first element is Mg. The horizontal axis of FIG. 7 is a concentration CMg of Mg ($\times 10^{17}$ cm$^{-3}$) in the fourth semiconductor region 14. The vertical axis is the sheet resistance Rs ($\Omega/\square$). As described above, the sheet resistance Rs is about 530$\Omega/\square$ when the fourth semiconductor region 14 is not provided. In FIG. 7, the thickness (the length t14) of the fourth semiconductor region 14 is 200 nm.

It can be seen from FIG. 7 that the sheet resistance Rs is low when the concentration CMg of Mg is low. There is a tendency for the sheet resistance Rs to increase as the concentration CMg of Mg increases. The increase of the sheet resistance Rs saturates when the concentration CMg of Mg is $5\times10^{17}$ cm$^{-3}$ or more.

From FIG. 7, it can be seen that an excessive increase of the sheet resistance is suppressed because a concentration CMg of Mg in the fourth semiconductor region 14 is not less than $1\times10^{17}$ cm$^{-3}$ and not more than $5\times10^{19}$ cm$^{-3}$. In the embodiment, it is favorable for the concentration of the first element in the fourth semiconductor region 14 to be not less than $1\times10^{17}$ cm$^{-3}$ and not more than $5\times10^{19}$ cm$^{-3}$.

It is favorable for the thickness (the length t14) of the fourth semiconductor region 14 (e.g., the first portion p1) to be not less than 50 nm and not more than 200 nm. A low on-resistance and a high threshold voltage are obtained easily thereby.

It is favorable for the concentration (a first concentration) of the first element in the first semiconductor region 11, the concentration (a second concentration) of the first element in the second semiconductor region 12, and the concentration (a third concentration) of the first element in the third semiconductor region 13 each to be not more than 1/10 of the concentration (a fourth concentration) of the first element in the fourth semiconductor region 14 (e.g., the first portion p1). For example, at least one of the first to third concentrations may be not more than 1/50 of the fourth concentration. For example, at least one of the first to third concentrations may be not more than 1/100 of the fourth concentration. For example, the first concentration is the concentration of the first element at the second-direction center (the Z-axis direction center) of the first semiconductor region 11. For example, the second concentration is the concentration of the first element at the second-direction center (the Z-axis direction center) of the second semiconductor region 12. For example, the third concentration is the concentration of the first element at the second-direction center (the Z-axis direction center) of the third semiconductor region 13. For example, the fourth concentration is the concentration of the first element at the second-direction center (the Z-axis direction center) of the fourth semiconductor region 14.

Figure 8:
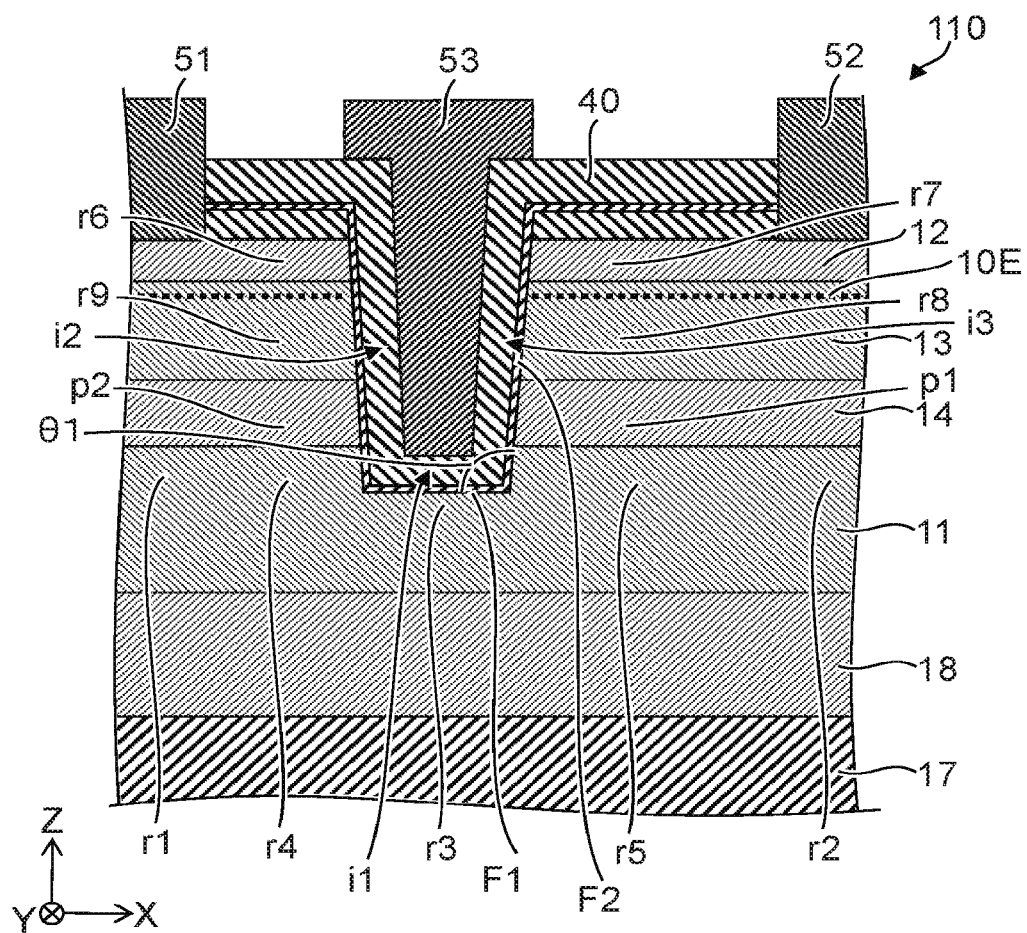
FIG. 8 is a schematic cross-sectional view illustrating the semiconductor device according to the first embodiment.

FIG. 8 is a schematic cross-sectional view illustrating the semiconductor device according to the first embodiment.

In the semiconductor device 110 as shown in FIG. 8, the first insulating region i1 has a first surface F1 opposing the third partial region r3. The third insulating region i3 has a second surface F2 opposing the eighth partial region r8. The angle between the first surface F1 and the second surface F2 is taken as an angle θ1. In the semiconductor device 110, θ1 is greater than 95 degrees and not more than 120 degrees. The second surface F2 of the third insulating region i3 is, for example, a forward-tapered surface. By employing such a forward-tapered surface, the local electric field concentration at the end portion can be relaxed. High reliability is obtained easily.

Figure 9:
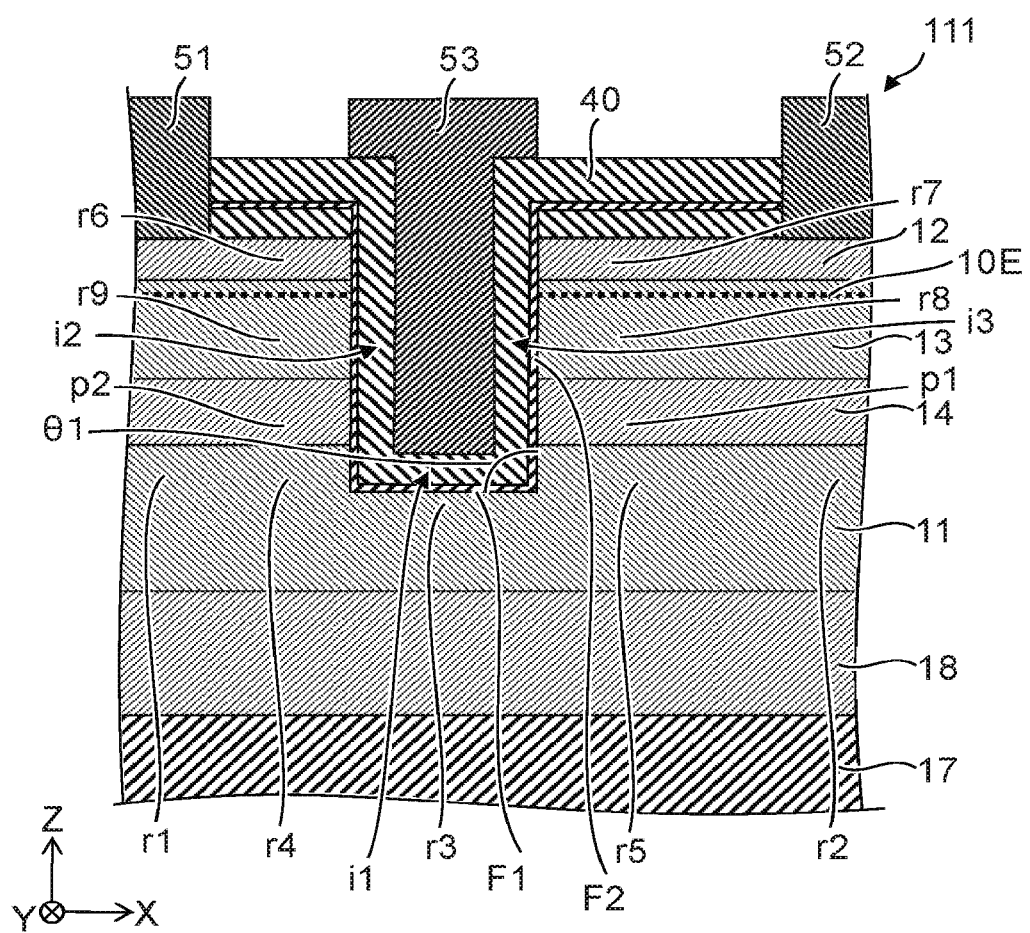
FIG. 9 is a schematic cross-sectional view illustrating a semiconductor device according to the first embodiment.
Figure 10:
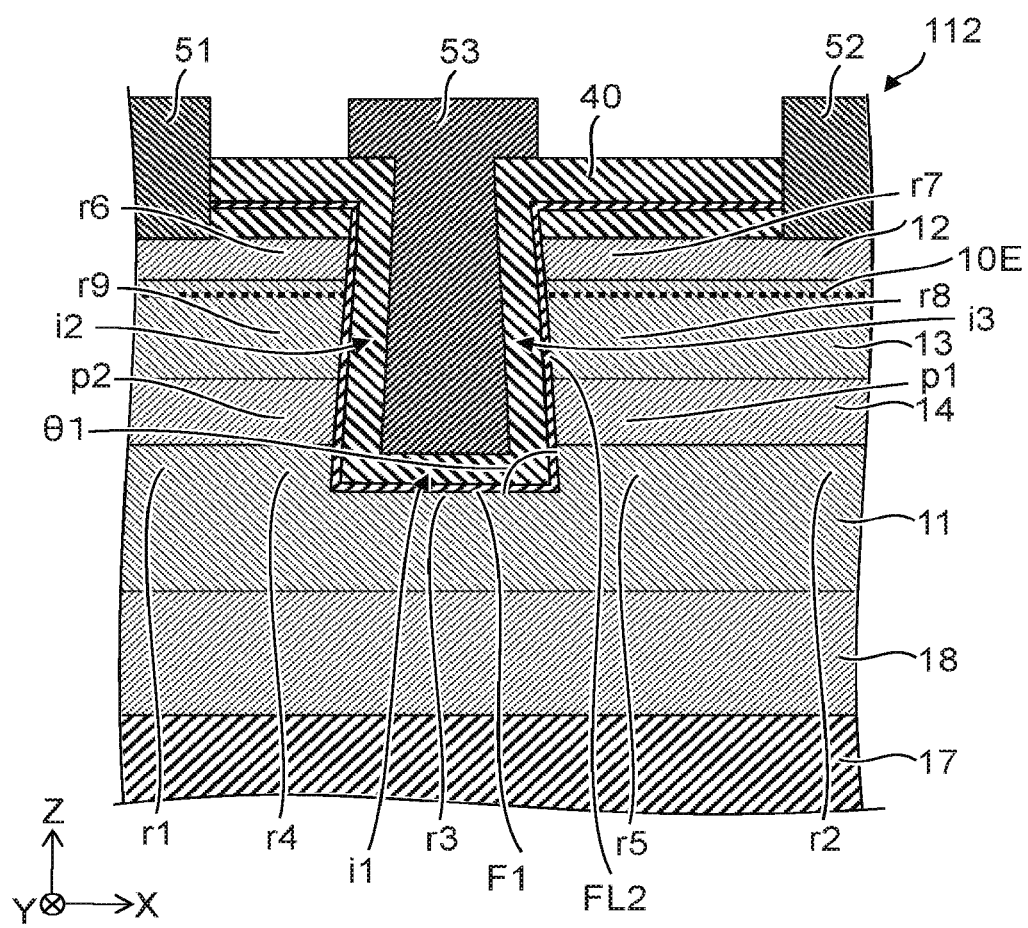
FIG. 10 is a schematic cross-sectional view illustrating a semiconductor device according to the first embodiment.

FIG. 9 and FIG. 10 are schematic cross-sectional views illustrating semiconductor devices according to the first embodiment.

As shown in FIG. 9 and FIG. 10, semiconductor devices 111 and 112 according to the embodiment also include the first electrode 51, the second electrode 52, the third electrode 53, the first semiconductor region 11, the second semiconductor region 12, the third semiconductor region 13, the fourth semiconductor region 14, and the insulating part 40. In the semiconductor devices 111 and 112, the angle θ1 of the second surface F2 of the third insulating region i3 is different from the angle θ1 of the semiconductor device 110. Otherwise, the configurations of the semiconductor devices 111 and 112 are similar to the configuration of the semiconductor device 110.

In the semiconductor device 111 shown in FIG. 9, the angle θ1 is greater than 85 degrees and not more than 95 degrees. In the semiconductor device 111, the second surface F2 is a substantially perpendicular surface. In the semiconductor device 111, for example, a higher threshold voltage is obtained.

In the semiconductor device 112 shown in FIG. 10, the angle θ1 is greater than 60 degrees and less than 90 degrees. In the semiconductor device 112, the second surface F2 is a reverse-tapered surface. In the semiconductor device 112, for example, an even higher threshold voltage is obtained.

Figure 11:
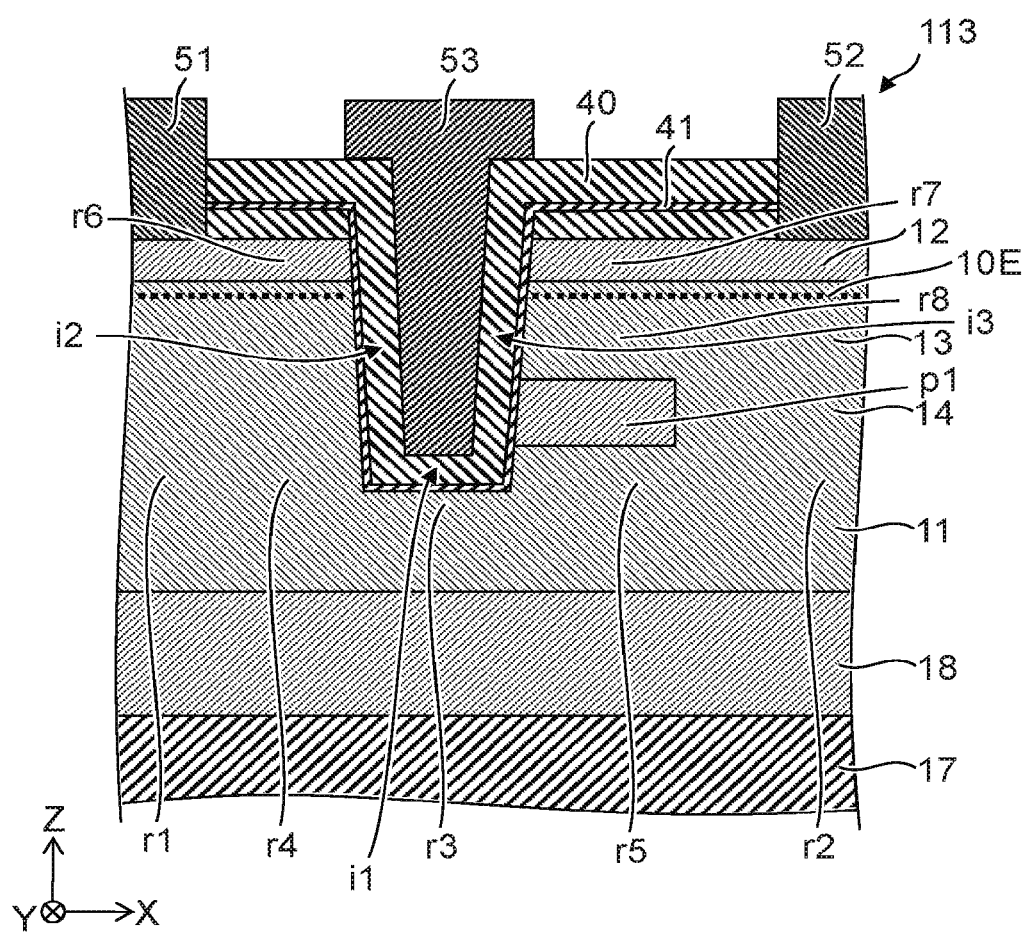
FIG. 11 is a schematic cross-sectional view illustrating a semiconductor device according to the first embodiment.

FIG. 11 is a schematic cross-sectional view illustrating a semiconductor device according to the first embodiment.

In the semiconductor device 113 as shown in FIG. 11, the first portion p1 is provided; and the second portion p2 is omitted. The first portion p1 is provided at a portion between the first semiconductor region 11 and the third semiconductor region 13. Otherwise, the configuration of the semiconductor device 113 is similar to the configuration of the semiconductor device 110.

It is sufficient for the fourth semiconductor region 14 having the function of increasing the threshold voltage to be provided in a portion of the current path. It is sufficient for the fourth semiconductor region 14 to be provided in a portion of the region between the first semiconductor region 11 and the second semiconductor region 12. A high threshold voltage and a low on-resistance are obtained thereby.

Figure 12:
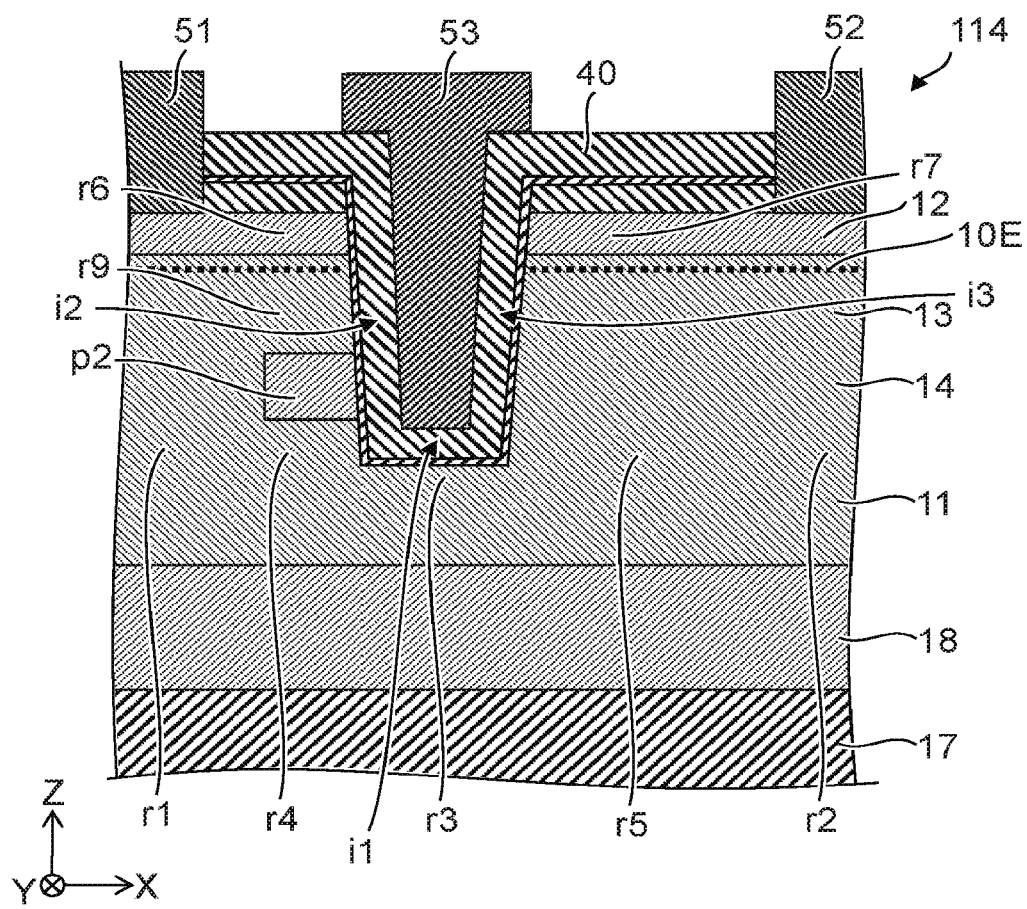
FIG. 12 is a schematic cross-sectional view illustrating a semiconductor device according to the first embodiment.

FIG. 12 is a schematic cross-sectional view illustrating a semiconductor device according to the first embodiment.

In the semiconductor device 114 as shown in FIG. 12, the second portion p2 is provided; and the first portion p1 is omitted. The second portion p2 is provided at a portion between the first semiconductor region 11 and the third semiconductor region 13. In the semiconductor device 114, the second portion p2 may be replaced in the description with the first portion p1. In such a case, the first electrode 51 and the second electrode 52 are interchanged. In the semiconductor device 114 as well, a high threshold voltage and a low on-resistance are obtained.

Figure 13:
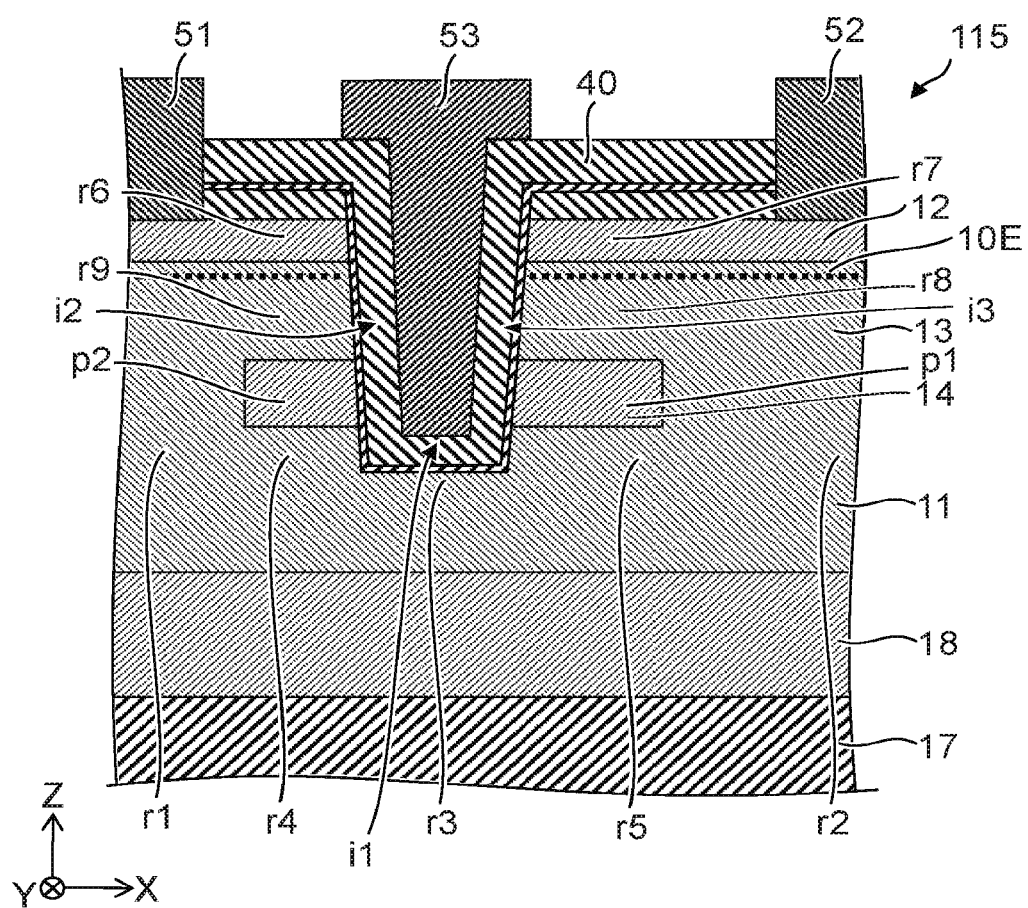
FIG. 13 is a schematic cross-sectional view illustrating a semiconductor device according to the first embodiment.

FIG. 13 is a schematic cross-sectional view illustrating a semiconductor device according to the first embodiment.

As shown in FIG. 13, the first portion p1 and the second portion p2 are provided in the semiconductor device 115. The first portion p1 is provided at a portion between the first semiconductor region 11 and the third semiconductor region 13. The second portion p2 is provided at a portion between the first semiconductor region 11 and the third semiconductor region 13. In the semiconductor device 115, a high threshold voltage and a low on-resistance are obtained.

Second Embodiment

Figure 14:
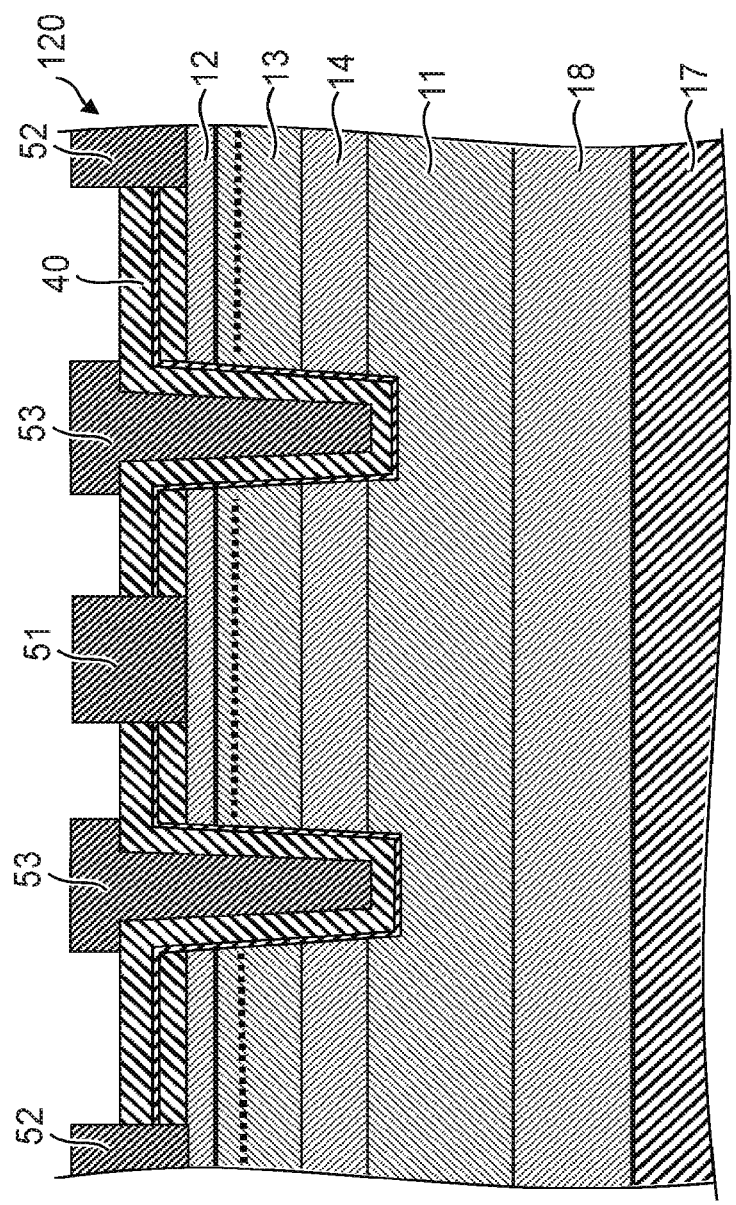
FIG. 14 is a schematic cross-sectional view illustrating a semiconductor device according to a second embodiment.

FIG. 14 is a schematic cross-sectional view illustrating a semiconductor device according to a second embodiment.

In the semiconductor device 120 as shown in FIG. 14, multiple second electrodes 52 are provided; and multiple third electrodes 53 are provided. The first electrode 51 is between one of the multiple second electrodes 52 and another one of the multiple second electrodes 52 in the first direction (the X-axis direction). One of the multiple third electrodes 53 is between the first electrode 51 and the one of the multiple second electrodes 52 in the first direction (the X-axis direction). Another one of the multiple third electrodes 53 is between the first electrode 51 and the other one of the multiple second electrodes 52 in the first direction (the X-axis direction).

Thus, multiple sets including the first to third electrodes 51 to 53 may be provided. For example, the first to third electrodes 51 to 53 have band configurations extending in the Y-axis direction.

In the semiconductor device 120 as well, a high threshold voltage is obtained while obtaining a low on-resistance. According to the embodiments, a semiconductor device can be provided in which the characteristics can be improved.

The embodiments may include the following configurations (e.g., technological proposals).

Configuration 1

A semiconductor device, comprising:
a first electrode;
a second electrode;
a third electrode, a position of the third electrode in a first direction being between a position of the first electrode in the first direction and a position of the second electrode in the first direction, the first direction being from the first electrode toward the second electrode;
a first semiconductor region including $Al_{x1}Ga_{1-x1}N$ ($0 \leq x1 < 1$) and including a first partial region, a second partial region, a third partial region, a fourth partial region, and a fifth partial region, a second direction from the first partial region toward the first electrode crossing the first direction, a direction from the second partial region toward the second electrode being along the second direction, a direction from the third partial region toward the third electrode being along the second direction, the fourth partial region being between the first partial region and the third partial region in the first direction, the fifth partial region being between the third partial region and the second partial region in the first direction;
a second semiconductor region including $Al_{x2}Ga_{1-x2}N$ ($0 < x2 \leq 1$ and $x1 < x2$) and including a sixth partial region and a seventh partial region, a direction from the fourth partial region toward the sixth partial region being along the second direction, a direction from the fifth partial region toward the seventh partial region being along the second direction;
a third semiconductor region including $Al_{x3}Ga_{1-x3}N$ ($0 \leq x3 < 1$ and $x3 < x2$), the third semiconductor region including an eighth partial region, the eighth partial region being between the fifth partial region and the seventh partial region;
a fourth semiconductor region including $Al_{x4}Ga_{1-x4}N$ ($0 \leq x4 < 1$ and $x4 < x2$), the fourth semiconductor region including a first portion, the first portion being between the fifth partial region and the eighth partial region, the fourth semiconductor region including a first element including at least one selected from the group consisting of Mg and Zn, the first semiconductor region, the second semiconductor region, and the third semiconductor region not including the first element, or a first concentration of the first element in the first semiconductor region, a second concentration of the first element in the second semiconductor region, and a third concentration of the first element in the third semiconductor region each being lower than a fourth concentration of the first element in the fourth semiconductor region; and
an insulating part, the insulating part including a first insulating region, a second insulating region, and a third insulating region, the first insulating region being between the third partial region and the third electrode in the second direction and between a portion of the fourth partial region and a portion of the fifth partial region in the first direction, the second insulating region being between the sixth partial region and the third electrode in the first direction, the third insulating region being between the third electrode and the first portion in the first direction, between the third electrode and the eighth partial region in the first direction, and between the third electrode and the seventh partial region in the first direction.

Configuration 2

The semiconductor device according to Configuration 1, wherein the first portion contacts the third insulating region.

Configuration 3

The semiconductor device according to Configuration 1 or 2, wherein a length along the first direction of the first insulating region is longer than a length along the second direction of the first portion.

Configuration 4

The semiconductor device according to any one of Configurations 1 to 3, wherein
the third semiconductor region includes a ninth partial region, the ninth partial region being between the fourth partial region and the sixth partial region,
the fourth semiconductor region further includes a second portion,
the second portion is between the fourth partial region and the ninth partial region, and
in the first direction, a portion of the second insulating region is between the second portion and the third electrode and between the ninth partial region and the third electrode.

Configuration 5

The semiconductor device according to any one of Configurations 1 to 4, wherein
the first insulating region has a first surface opposing the third partial region,
the third insulating region has a second surface opposing the eighth partial region, and
an angle between the first surface and the second surface is greater than 95 degrees and not more than 120 degrees.

Configuration 6

The semiconductor device according to any one of Configurations 1 to 4, wherein
the first insulating region has a first surface opposing the third partial region,
the third insulating region has a second surface opposing the eighth partial region, and
an angle between the first surface and the second surface is greater than 85 degrees and not more than 95 degrees.

Configuration 7

The semiconductor device according to any one of Configurations 1 to 4, wherein
the first insulating region has a first surface opposing the third partial region,
the third insulating region has a second surface opposing the eighth partial region, and
an angle between the first surface and the second surface is greater than 60 degrees and less than 90 degrees.

Configuration 8

The semiconductor device according to any one of Configurations 1 to 4, wherein the first portion has a first opposing surface opposing the third insulating region, and the first opposing surface crosses a c-plane of the first semiconductor region.

Configuration 9

The semiconductor device according to any one of Configurations 1 to 4, wherein the first portion has a first opposing surface opposing the third insulating region, and the first opposing surface is along an M-plane or an a-plane of the first semiconductor region.

Configuration 10

The semiconductor device according to any one of Configurations 1 to 9, wherein the concentration of the first element in the fourth semiconductor region is not less than $1 \times 10^{17}$ cm$^{-3}$ and not more than $5 \times 10^{19}$ cm$^{-3}$.

Configuration 11

The semiconductor device according to any one of Configurations 1 to 10, wherein a length along the second direction of the first portion is not less than 50 nm and not more than 200 nm.

Configuration 12

The semiconductor device according to any one of Configurations 1 to 11, wherein a length along the second direction of the eighth partial region is not less than 100 nm and not more than 400 nm.

Configuration 13

The semiconductor device according to any one of Configurations 1 to 12, wherein the concentration of the first element in the first semiconductor region, the concentration of the first element in the second semiconductor region, and the concentration of the first element in the third semiconductor region each are not more than 1/10 of the concentration of the first element in the fourth semiconductor region.

Configuration 14

The semiconductor device according to any one of Configurations 1 to 13, wherein the insulating part includes a first film including Al$_{x5}$Ga$_{1-x5}$N (0<x5≤1, x1<x5, x3<x5, and x4<x5), the first film includes a first film portion, a second film portion, and a third film portion, the first film portion is between the third partial region and the third electrode in the second direction and between a portion of the fourth partial region and a portion of the fifth partial region in the first direction, the second film portion is between the sixth partial region and the third electrode in the first direction, and in the first direction, the third film portion is between the third electrode and the first portion, between the third electrode and the eighth partial region, and between the third electrode and the seventh partial region.

Configuration 15

The semiconductor device according to Configuration 14, wherein the insulating part includes a second film including oxygen and at least one selected from the group consisting of silicon, aluminum, and hafnium, and the second film is between the first film and the third electrode.

Configuration 16

The semiconductor device according to Configuration 14 or 15, wherein the insulating part includes a third film including nitrogen and at least one selected from the group consisting of silicon and aluminum, the third film includes a first film region and a second film region, the sixth partial region is between the fourth partial region and the first film region in the second direction, and the seventh partial region is between the eighth partial region and the second film region in the second direction.

Configuration 17

The semiconductor device according to any one of Configurations 1 to 16, wherein a portion of the third electrode is between the portion of the fourth partial region and the portion of the fifth partial region in the first direction.

Configuration 18

The semiconductor device according to any one of Configurations 1 to 17, wherein the first electrode contacts the sixth partial region, and the second electrode contacts the seventh partial region.

Configuration 19

The semiconductor device according to any one of Configurations 1 to 18, wherein a distance along the first direction between the first electrode and the third electrode is shorter than a distance along the first direction between the third electrode and the second electrode.

Configuration 20

The semiconductor device according to any one of Configurations 1 to 19, wherein a plurality of the second electrodes is provided, a plurality of the third electrodes is provided, the first electrode is between one of the plurality of second electrodes and an other one of the plurality of second electrodes in the first direction, one of the plurality of third electrodes is between the first electrode and the one of the plurality of second electrodes in the first direction, and an other one of the plurality of third electrodes is between the first electrode and the other one of the plurality of second electrodes in the first direction.

Configuration 21

The semiconductor device according to Configuration 15, wherein the second film further includes nitrogen.

Configuration 22

The semiconductor device according to Configuration 16, wherein the third film further includes oxygen.

According to the embodiments, a semiconductor device can be provided in which the characteristics can be improved.

In the specification, "nitride semiconductor" includes all compositions of semiconductors of the chemical formula B$_x$In$_y$Al$_z$Ga$_{1-x-y-z}$N (0≤x≤1, 0≤y≤1, 0≤z≤1, and x+y+z≤1) for which the composition ratios x, y, and z are changed within the ranges respectively. "Nitride semiconductor" further includes Group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor regions, electrodes, insulating parts, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a second electrode;
   a third electrode, a position of the third electrode in a first direction being between a position of the first electrode in the first direction and a position of the second electrode in the first direction, the first direction being from the first electrode toward the second electrode;
   a first semiconductor region including $Al_{x1}Ga_{1-x1}N$ ($0 \leq x1 < 1$) and including a first partial region, a second partial region, a third partial region, a fourth partial region, and a fifth partial region, a second direction from the first partial region toward the first electrode crossing the first direction, a direction from the second partial region toward the second electrode being along the second direction, a direction from the third partial region toward the third electrode being along the second direction, the fourth partial region being between the first partial region and the third partial region in the first direction, the fifth partial region being between the third partial region and the second partial region in the first direction;
   a second semiconductor region including $Al_{x2}Ga_{1-x2}N$ ($0 < x2 \leq 1$ and $x1 < x2$) and including a sixth partial region and a seventh partial region, a direction from the fourth partial region toward the sixth partial region being along the second direction, a direction from the fifth partial region toward the seventh partial region being along the second direction;
   a third semiconductor region including $Al_{x3}Ga_{1-x3}N$ ($0 \leq x3 < 1$ and $x3 < x2$), the third semiconductor region including an eighth partial region, the eighth partial region being between the fifth partial region and the seventh partial region;
   a fourth semiconductor region including $Al_{x4}Ga_{1-x4}N$ ($0 \leq x4 < 1$ and $x4 < x2$), the fourth semiconductor region including a first portion, the first portion being between the fifth partial region and the eighth partial region, the fourth semiconductor region including a first element including at least one selected from the group consisting of Mg, Zn, and C, the first semiconductor region, the second semiconductor region, and the third semiconductor region not including the first element, or a concentration of the first element in the first semiconductor region, a concentration of the first element in the second semiconductor region, and a concentration of the first element in the third semiconductor region each being lower than a concentration of the first element in the fourth semiconductor region; and
   an insulating part, the insulating part including a first insulating region, a second insulating region, and a third insulating region, the first insulating region being between the third partial region and the third electrode in the second direction and between a portion of the fourth partial region and a portion of the fifth partial region in the first direction, the second insulating region being between the sixth partial region and the third electrode in the first direction, the third insulating region being between the third electrode and the first portion in the first direction, between the third electrode and the eighth partial region in the first direction, and between the third electrode and the seventh partial region in the first direction.

2. The device according to claim 1, wherein the first portion contacts the third insulating region.

3. The device according to claim 1, wherein a length along the first direction of the first insulating region is longer than a length along the second direction of the first portion.

4. The device according to claim 1, wherein
   the third semiconductor region includes a ninth partial region, the ninth partial region being between the fourth partial region and the sixth partial region,
   the fourth semiconductor region further includes a second portion,
   the second portion is between the fourth partial region and the ninth partial region, and
   in the first direction, a portion of the second insulating region is between the second portion and the third electrode and between the ninth partial region and the third electrode.

5. The device according to claim 1, wherein
   the first insulating region has a first surface opposing the third partial region,
   the third insulating region has a second surface opposing the eighth partial region, and
   an angle between the first surface and the second surface is greater than 95 degrees and not more than 120 degrees.

6. The device according to claim 1, wherein
   the first insulating region has a first surface opposing the third partial region,
   the third insulating region has a second surface opposing the eighth partial region, and
   an angle between the first surface and the second surface is greater than 85 degrees and not more than 95 degrees.

7. The device according to claim 1, wherein
the first insulating region has a first surface opposing the third partial region,
the third insulating region has a second surface opposing the eighth partial region, and
an angle between the first surface and the second surface is greater than 60 degrees and less than 90 degrees.

8. The device according to claim 1, wherein
the first portion has a first opposing surface opposing the third insulating region, and
the first opposing surface crosses a c-plane of the first semiconductor region.

9. The device according to claim 1, wherein
the first portion has a first opposing surface opposing the third insulating region, and
the first opposing surface is along an m-plane or an a-plane of the first semiconductor region.

10. The device according to claim 1, wherein the concentration of the first element in the fourth semiconductor region is not less than $1 \times 10^{17}$ cm$^{-3}$ and not more than $5 \times 10^{19}$ cm$^{-3}$.

11. The device according to claim 1, wherein a length along the second direction of the first portion is not less than 50 nm and not more than 200 nm.

12. The device according to claim 1, wherein a length along the second direction of the eighth partial region is not less than 100 nm and not more than 400 nm.

13. The device according to claim 1, wherein the concentration of the first element in the first semiconductor region, the concentration of the first element in the second semiconductor region, and the concentration of the first element in the third semiconductor region each are not more than $\frac{1}{10}$ of the concentration of the first element in the fourth semiconductor region.

14. The device according to claim 1, wherein
the insulating part includes a first film including Al$_{x5}$Ga$_{1-x5}$N ($0 < x5 \leq 1$, $x1 < x5$, $x3 < x5$, and $x4 < x5$),
the first film includes a first film portion, a second film portion, and a third film portion,
the first film portion is between the third partial region and the third electrode in the second direction and between a portion of the fourth partial region and a portion of the fifth partial region in the first direction,
the second film portion is between the sixth partial region and the third electrode in the first direction, and
the third film portion is between the third electrode and the first portion in the first direction, between the third electrode and the eighth partial region in the first direction, and between the third electrode and the seventh partial region in the first direction.

15. The device according to claim 14, wherein
the insulating part includes a second film including oxygen and at least one selected from the group consisting of silicon, aluminum, and hafnium, and
the second film is between the first film and the third electrode.

16. The device according to claim 14, wherein
the insulating part includes a third film including nitrogen and at least one selected from the group consisting of silicon and aluminum,
the third film includes a first film region and a second film region,
the sixth partial region is between the fourth partial region and the first film region in the second direction, and
the seventh partial region is between the eighth partial region and the second film region in the second direction.

17. The device according to claim 1, wherein a portion of the third electrode is between the portion of the fourth partial region and the portion of the fifth partial region in the first direction.

18. The device according to claim 1, wherein
the first electrode contacts the sixth partial region, and
the second electrode contacts the seventh partial region.

19. The device according to claim 1, wherein a distance along the first direction between the first electrode and the third electrode is shorter than a distance along the first direction between the third electrode and the second electrode.

20. The device according to claim 1, wherein
a plurality of the second electrodes is provided,
a plurality of the third electrodes is provided,
the first electrode is between one of the plurality of second electrodes and an other one of the plurality of second electrodes in the first direction,
one of the plurality of third electrodes is between the first electrode and the one of the plurality of second electrodes in the first direction, and
an other one of the plurality of third electrodes is between the first electrode and the other one of the plurality of second electrodes in the first direction.

* * * * *